United States Patent
Kim et al.

(10) Patent No.: US 8,513,779 B2
(45) Date of Patent: *Aug. 20, 2013

(54) CMOS DEVICES INCORPORATING HYBRID ORIENTATION TECHNOLOGY (HOT) WITH EMBEDDED CONNECTORS

(75) Inventors: Byeong Y. Kim, Lagrangeville, NY (US); Xiaomeng Chen, Poughkeepsie, NY (US); Yoichi Otani, Bargen BE (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/559,877

(22) Filed: Jul. 27, 2012

(65) Prior Publication Data
US 2012/0292668 A1  Nov. 22, 2012

Related U.S. Application Data

(60) Continuation of application No. 12/555,350, filed on Sep. 8, 2008, now Pat. No. 8,237,247, which is a division of application No. 11/470,819, filed on Sep. 7, 2006, now Pat. No. 7,595,232.

(51) Int. Cl.
  *H01L 29/04* (2006.01)
(52) U.S. Cl.
  USPC .......................... 257/627; 257/369
(58) Field of Classification Search
  USPC ................................. 257/369, 627
  See application file for complete search history.

(56) References Cited

U.S. PATENT DOCUMENTS

| | | | |
|---|---|---|---|
| 4,922,317 A | 5/1990 | Mihara | |
| 5,070,388 A | 12/1991 | Wade et al. | |
| 5,264,721 A | 11/1993 | Gotou | |
| 5,349,228 A | 9/1994 | Neudeck et al. | |
| 5,384,476 A | 1/1995 | Nishizawa et al. | |
| 5,573,969 A | 11/1996 | Kim | |
| 6,972,478 B1 | 12/2005 | Waite et al. | |
| 7,023,055 B2 | 4/2006 | Ieong et al. | |
| 7,329,923 B2 | 2/2008 | Doris et al. | |
| 7,393,730 B2 | 7/2008 | Hsu et al. | |
| 2004/0256700 A1 | 12/2004 | Doris et al. | |
| 2005/0093104 A1 | 5/2005 | Ieong et al. | |
| 2005/0116290 A1 | 6/2005 | de Souza et al. | |
| 2005/0280121 A1 | 12/2005 | Doris et al. | |

FOREIGN PATENT DOCUMENTS
JP 2005260240 9/2005

*Primary Examiner* — Tucker Wright
(74) *Attorney, Agent, or Firm* — Scully, Scott, Murphy & Presser, P.C.; Ian D. MacKinnon, Esq.

(57) ABSTRACT

The present invention relates to complementary devices, such as n-FETs and p-FETs, which have hybrid channel orientations and are connected by conductive connectors that are embedded in a semiconductor substrate. Specifically, the semiconductor substrate has at least first and second device regions of different surface crystal orientations (i.e., hybrid orientations). An n-FET is formed at one of the first and second device regions, and a p-FET is formed at the other of the first and second device regions. The n-FET and the p-FET are electrically connected by a conductive connector that is located between the first and second device regions and embedded in the semiconductor substrate. Preferably, a dielectric spacer is first provided between the first and second device regions and recessed to form a gap therebetween. The conductive connector is then formed in the gap above the recessed dielectric spacer.

18 Claims, 6 Drawing Sheets

CMOS DEVICES INCORPORATING HYBRID ORIENTATION TECHNOLOGY (HOT) WITH EMBEDDED CONNECTORS

CROSS REFERENCE TO RELATED APPLICATIONS

This application is a continuation of U.S. patent application Ser. No. 12/555,350, filed Sep. 8, 2009, which is a divisional of U.S. patent application Ser. No. 11/470,819, filed Sep. 7, 2006, now U.S. Pat. No. 7,595,232, the entire content and disclosure of which is incorporated herein by reference.

FIELD OF THE INVENTION

This invention relates to semiconductor devices that are formed at device regions of different surface crystal orientations (i.e., hybrid orientations) and are connected by conductive connectors embedded in the semiconductor substrate. More specifically, the present invention relates to complementary metal-oxide-semiconductor (CMOS) devices, such as n-channel field effect transistors (n-FETs) and p-channel field effect transistors (p-FETs), which have hybrid channel orientations and are connected by conductive connectors that are embedded in a semiconductor substrate, as well as methods for fabricating such CMOS devices.

BACKGROUND OF THE INVENTION

For single crystal semiconductor materials, all lattice directions and lattice planes in a unit cell of a single crystal material can be described by a mathematical description known as a Miller Index. On one hand, the notation [hkl] in the Miller Index defines a crystal direction or orientation, such as the [001], [100], [010], [110], and [111] directions in a cubic unit cell of single crystal silicon. On the other hand, the crystal planes or facets of a single crystal silicon unit cell are defined by the notation (hkl) in Miller Index, which refers to a particular crystal plane or facet that is perpendicular to the [hkl] direction. For example, the crystal planes (100), (110), and (111) of the single crystal silicon unit cells are respectively perpendicular to the [100], [110], and [111] directions. Additional, because the unit cells are periodic in a semiconductor crystal, there exist families or sets of equivalent crystal directions and planes. The notation <hkl> in the Miller Index therefore defines a family or set of equivalent crystal directions or orientations. For example, the <100> directions include the equivalent crystal directions of [100], [010], and [001]; the <110> directions include the equivalent crystal directions of [110], [011], [101], [−1−10], [0−1−1], [−10−1], [410], [0−11], [−101], [1−10], [01−1], and [10−1]; and the <111> directions include the equivalent crystal directions of [111], [−111], [1−11], and [11−1]. Similarly, the notation {hkl} defines a family or set of equivalent crystal planes or facets that are respectively perpendicular to the <hkl> directions. For example, the {100} planes include the set of equivalent crystal planes that are respectively perpendicular to the <100> directions.

In present semiconductor technology, CMOS devices, such as n-FETs and p-FETs, are typically fabricated on semiconductor wafers that have a single crystal direction. In particular, most of today's semiconductor devices are built upon Si substrates oriented along the {100} planes of Si.

Electrons are known to have a high mobility on the {100} planes of Si, but holes are known to have a high mobility on the {110} planes of Si. On one hand, hole mobility values on the {100} surfaces of Si are approximately 2 times lower than the hole mobility values on the {110} surfaces of Si. Therefore, p-FETs formed on a {110} Si surface will exhibit significantly higher drive currents than p-FETs formed on a {100} Si surface. On the other hand, electron mobility values on the {110} surfaces of Si are significantly degraded in comparison with the {100} Si surfaces. Therefore, the {100} Si surfaces are more optimal for forming n-FETs.

Methods for forming planar substrates with different device regions of different surface crystal orientations, which are commonly referred to as the hybrid orientation technology (HOT), have been previously described by, for example, U.S. Patent Application Publications No. 2005/0093104 and 2005/0256700.

FIGS. 1A-1F illustrate processing steps typically used for forming CMOS devices with the HOT substrates. Specifically, FIG. 1A shows a semiconductor-on-insulator (SOI) structure that comprises a base semiconductor substrate layer 112 having a first surface crystal orientation, a buried insulator layer 114, and a semiconductor device layer 116 having a second, different surface crystal orientation. A dielectric hard mask layer 118 is deposited over the SOI substrate.

The dielectric hard mask layer 118 is subsequently patterned and then used for selectively removing portions of the underlying semiconductor device layer 116 and the insulator layer 114, thereby resulting in a trench 120 that extends through layers 116 and 114 and exposes an upper surface of the base semiconductor substrate layer 112. Dielectric spacers 122 are then formed over sidewalls of the trench 120, as shown in FIG. 1B.

Next, a selective epitaxial growth step is carried out to grow a semiconductor structure 124 on the exposed upper surface of the base semiconductor substrate layer 112, as shown in FIG. 1C. Because the dielectric spacers 122 cover the semiconductor device layer 116 on the sidewalls of the trench 120, semiconductor nucleation cannot occur on such trench sidewalls, and the selective epitaxial growth therefore can only proceed from the upper surface of the base semiconductor substrate layer 112 at the bottom of the trench 120. Correspondingly, the resulting semiconductor structure 124 has the same surface crystal orientation as the base semiconductor substrate layer 112 (i.e., the first surface crystal orientation), instead of the semiconductor device layer 116. After planarizing the entire structure to remove an over-growing portion of the semiconductor structure 124 and the entire dielectric hard mask layer 118, isolation regions 126 are formed in the substrate to define a first device region, which has a SOI structure including the semiconductor device layer 116 and the buried insulator layer 114 on the base semiconductor substrate layer 112, and a second device region, which has a bulk semiconductor structure including the epitaxially grown semiconductor structure 124 on the base semiconductor substrate layer 112, as shown in FIG. 1D. The resulting substrate is therefore a hybrid orientation substrate, because the first and second device regions have different surface crystal orientations, i.e., the semiconductor device layer 116 at the first device region has second, different crystal orientation while the epitaxially grown semiconductor structure 124 at the second device region has the first crystal orientation.

Subsequently, complementary transistors can be respectively formed at the first and second device regions of such a hybrid orientation substrate. For example, an n-FET comprising a source region (NS), a drain region (ND), and a gate conductor (NG) can be formed at the first device region, and a p-FET comprising a source region (PS), a drain region (PD), and a gate conductor (PG) can be formed at the second device region, as shown in FIG. 1E.

However, the first and second device regions of the hybrid orientation substrate are isolated from each other by the dielectric spacer 122, as shown in FIGS. 1D-1E. In order to electrically connect the n-FET and p-FET devices, a conductive connector 128 must be provided over the hybrid orientation substrate above the dielectric spacer 122, as shown in FIG. 1F, which requires additional processing steps and adds to the manufacturing costs of the n-FET and p-FET devices. Further, the conductive connector 128 protrudes above the substrate surface and further increases the contact resistances of the n-FET and p-FET devices.

There is a continuing need for improved CMOS device structures that can be fabricated by simplified processes at reduced costs.

SUMMARY OF THE INVENTION

The present invention solves the above-described problem by providing a conductive connector that is embedded in a hybrid orientation substrate for connecting adjacent n-FET and p-FET devices.

In one aspect, the present invention relates to a semiconductor device comprising:

a semiconductor substrate comprising at least first and second device regions of different surface crystal orientations;

an n-channel field effect transistor (n-FET); and a p-channel field effect transistor (p-FET), wherein the n-FET comprises source, drain, and channel regions that are located in one of the first and second device regions, wherein the p-FET comprises source, drain, and channel regions that are located in the other of the first and second device regions, and wherein the n-FET and p-FET are electrically connected by a conductive connector that is located between the first and second device regions and embedded in the semiconductor substrate.

Preferably, a recessed dielectric spacer is located between the first and second device regions under the conductive connector.

The first and second device regions may have either the same or different structures. For example, one of the first and second device regions can comprise a semiconductor-on-insulator (SOI) structure, while the other can comprise a bulk semiconductor structure. Alternatively, the first and second device regions can both comprise SOI structures or bulk semiconductor structures.

The conductive connector of the present invention preferably connects the drain (or source) region of the n-FET with the source (or drain) region of the p-FET, therefore forming a series connection between the n-FET and the p-FET. Alternatively, the conductive connector of the present invention may connect the drain or source regions of the n-FET and p-FET together, thereby forming a parallel connection between the n-FET and the p-FET.

In a specific embodiment of the present invention, the source, drain, and channel regions of the n-FET are located in the first device region, and the source, drain and channel regions of the p-FET are located in the second device region. Correspondingly, it is preferred that the first device region has a {100} surface crystal orientation, and the second device region has a {110} surface crystal orientation. It is important to note that other combinations of surface crystal orientations, although not specifically described herein, can also be used in the first and second device regions of the present invention.

In another aspect, the present invention relates to a method for fabricating a semiconductor device structure, comprising:

forming a semiconductor substrate that comprises at least first and second device regions of different surface crystal orientations, wherein the first and second device regions are separated from each other by a dielectric spacer that is located therebetween in the semiconductor substrate;

recessing the dielectric spacer to form a gap between the first and second device regions;

filling the gap with a conductive material, thereby forming a conductive connector that is located between the first and second device regions and embedded in the semiconductor substrate; and forming an n-FET and a p-FET, wherein the n-FET comprises source, drain, and channel regions located in one of the first and second device regions, wherein the p-FET comprises source, drain, and channel regions located in the other of the first and second device regions, and wherein the n-FET and p-FET are electrically connected by the conductive connector.

In a preferred, but not necessary, embodiment of the present invention, the semiconductor substrate as described hereinabove is formed by:

bonding one or more layers to a first semiconductor layer of a first surface crystal orientation, wherein said one or more layers comprises at least a second semiconductor layer of a second, different crystal orientation;

selective etching the one or more layers to form at least one opening that extends through said one or more layers to an upper surface of the first semiconductor layer;

forming a dielectric spacer on interior sidewalls of the at least one opening;

epitaxially growing a semiconductor structure in the at least one opening on the upper surface of the first semiconductor layer, wherein the epitaxially grown semiconductor structure has the first surface crystal orientation; and planarizing the epitaxially grown semiconductor structure to form the semiconductor substrate that comprises the first device region and the second device region of different surface crystal orientations, wherein an upper surface of the semiconductor structure is exposed at the first device region, and wherein an upper surface of the second semiconductor layer is exposed at the second device region.

The first and second device regions may comprise SOI structures or bulk semiconductor structures, or one of each. For example, when the one or more layers bonded to the first semiconductor layer comprise at least one insulator layer under the second semiconductor layer, the second device region so formed will comprise a SOI structure defined by the second semiconductor layer and the insulator layer. For another example, when the first semiconductor layer is located over an insulator layer, the first device region so formed will comprise a SOI structure defined by the epitaxially grown semiconductor structure, the first semiconductor layer and the insulator layer. However, when no insulator layer is presented, both the first and second device regions will comprise bulk semiconductor structures.

Further, isolation regions can be formed adjacent to the first and second device regions after the gap filling and before formation of the n-FET and the p-FET, so that the n-FET and p-FET so formed will be isolated from adjacent device structures.

A further aspect of the present invention relates to a semiconductor substrate comprising at least first and second device regions of different surface crystal orientations, wherein a conductive connector is located between the first and second device regions and is embedded in the semiconductor substrate.

A still further aspect of the present invention relates to a method comprising:

forming a semiconductor substrate that comprises at least first and second device regions of different surface crystal orientations, wherein the first and second device regions are separated from each other by a dielectric spacer that is located therebetween in the semiconductor substrate;

recessing the dielectric spacer to form a gap between the first and second device regions; and filling the gap with a conductive material, thereby forming a conductive connector that is located between the first and second device regions and embedded in the semiconductor substrate.

Other aspects, features and advantages of the invention will be more fully apparent from the ensuing disclosure and appended claims.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The following U.S. patent applications are incorporated herein by reference in their entireties for all purposes:

U.S. patent application Ser. No. 10/696,634 filed on Oct. 29, 2003 for "CMOS ON HYBRID SUBSTRATE WITH DIFFERENT CRYSTAL ORIENTATIONS USING SILICON-TO-SILICON DIRECT WAFER BONDING," now U.S. Pat. No. 7,023,055; and U.S. patent application Ser. No. 10/250,241 filed on Jun. 17, 2003 for "HIGH PERFORMANCE CMOS SOI DEVICES ON HYBRID CRYSTAL-ORIENTED SUBSTRATES," now U.S. Pat. No. 7,329,923.

The present invention provides an embedded connector for electrically connecting adjacent n-FET and p-FET devices that are formed at different device regions of different surface crystal orientations on a hybrid orientation substrate. The embedded connector of the present invention can be readily formed with minimum processing complexity. Specifically, the dielectric spacers is first recessed to form a divot or gap between the first and second device regions and then filling the divot or gap with a conductive material, such as doped poly-silicon.

FIGS. 2-10 illustrate exemplary processing steps that can be used to form a CMOS circuit with adjacent n-FET and p-FET connected by such an embedded connector, according to one embodiment of the present invention.

Figure 1A:
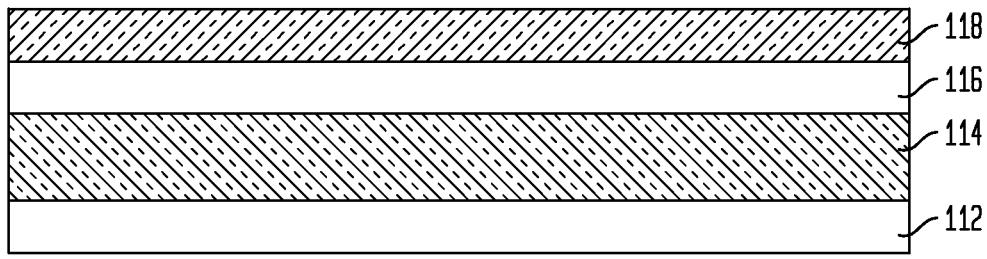
FIGS. 1A-1F are cross-sectional views illustrating processing steps for forming a convention CMOS device structure.
Figure 1B:
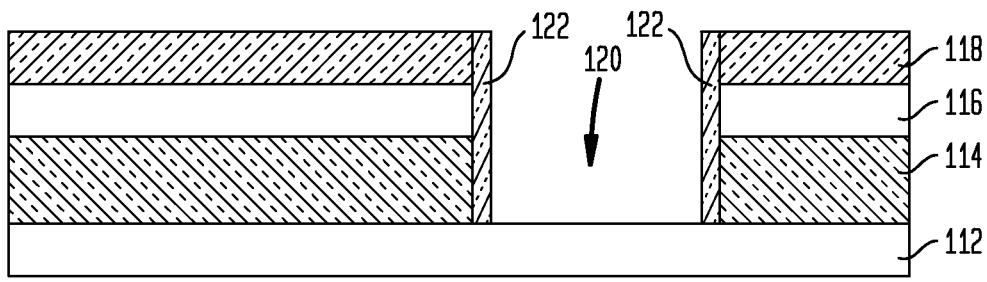
Figure 1C:
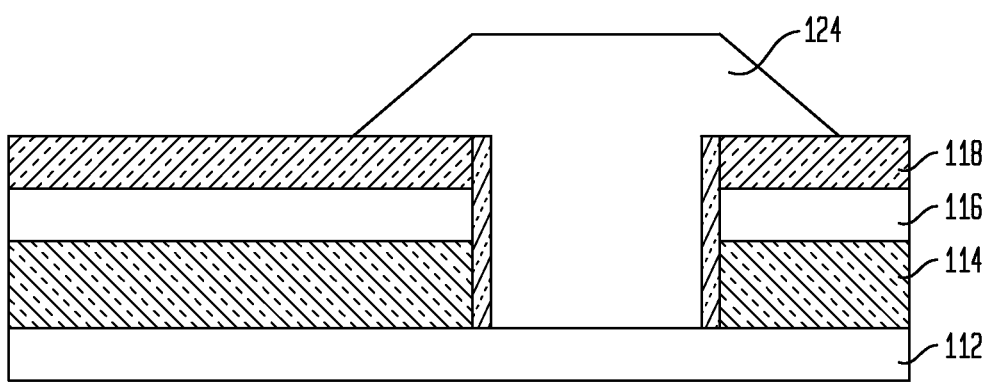
Figure 1D:
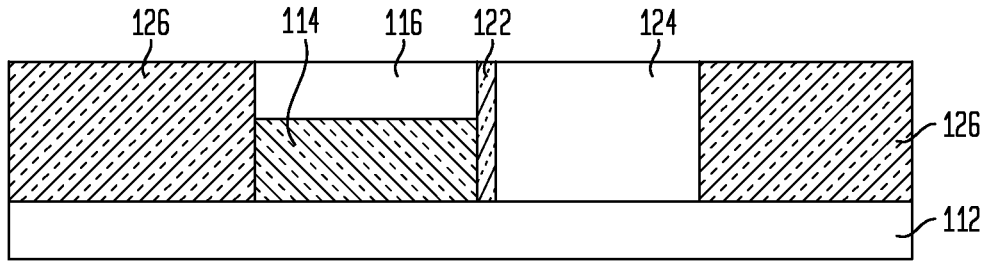
Figure 1E:
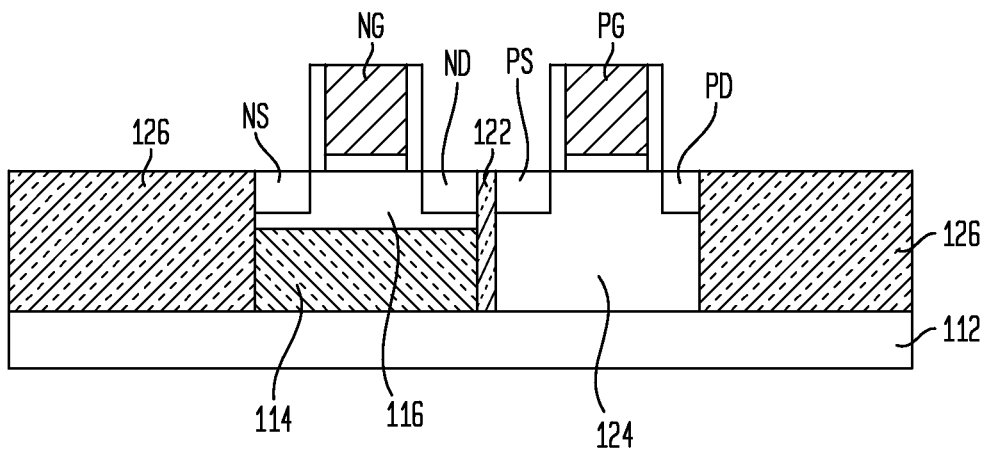
Figure 1F:
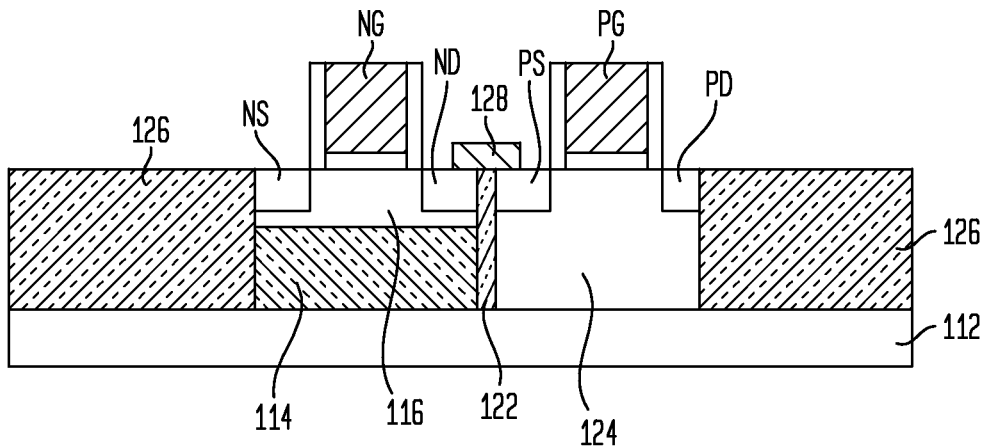
Figure 2:
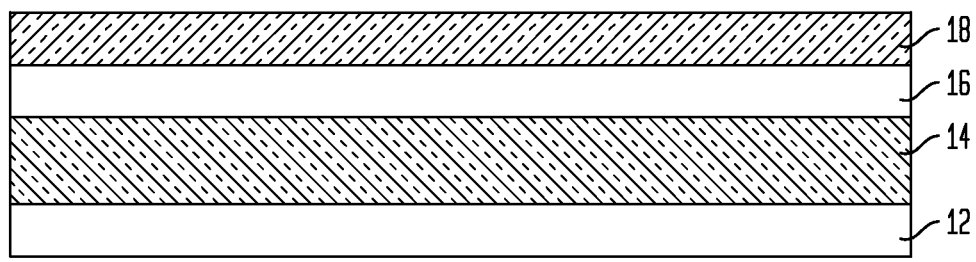
FIGS. 2-10 are cross-sectional views illustrating exemplary processing steps that can be used for forming CMOS device structure comprising an n-FET and a p-FET that is connected by an embedded connector, according to one embodiment of the present invention.

Reference is first made to FIG. 2, which shows bonding of a first semiconductor layer 12 of a first surface crystal orientation with an insulator layer 14 and a second semiconductor layer 16 of a second, different surface crystal orientation to form a bonded substrate. The different structural layers, as shown in FIG. 2, can be readily bonded together by conventional wafer bonding techniques, which are not described in detail herein.

The first and second semiconductor layers 12 and 16 may comprise any semiconductor material, including, but not limited to: Si, SiC, SiGe, SiGeC, Ge alloys, GaAs, InAs, InP, as well as other III-V or II-VI compound semiconductors. Such semiconductor layers may comprise a doped or undoped bulk wafer, a bulk wafer containing an ion implanted region, such as an $H_2$ implant region that can be used to split a portion of such wafer, a preformed SOI wafer, or a layered semiconductor structure such as, for example, Si/SiGe. In one preferred embodiment, both the first and second semiconductor layers 12 and 16 comprise a Si-containing semiconductor material.

The thickness of the second semiconductor layer 16 may vary widely, depending on the specific application requirements. Preferably, the second semiconductor layer 16 has an initial thickness from about 5 nm to about 150 nm, which can be subsequently thinned to a thickness of 40 nm or less by planarization, grinding, wet etching, dry etching or any combination thereof.

The first and second semiconductor layers 12 and 16 can be directly bonded together, without incorporation of any insulator layer, for fabrication of a hybrid orientation substrate that comprises two sets of bulk semiconductor device regions of different surface crystal orientations (not shown). Alternatively, one or more interfacial insulator layers may be provided between the first and second semiconductor layers 12 and 16 for fabrication of a hybrid orientation substrate containing at least one bulk semiconductor region and at least one SOI region of different surface crystal orientation. Further, one or more additional insulator layers (not shown) can be provided under the first semiconductor layer 12 for fabrication of a hybrid orientation substrate containing two sets of SOI regions of different crystal orientations.

Preferably, but not necessarily, an interfacial insulator layer 14 is provided between the first and second semiconductor layers 12 and 16. The interfacial insulator layer 14 may comprise an oxide, nitride, oxynitride, or other like insulator material that is formed on one or both of the wafers 12 and 16 prior to bonding.

Optionally, a surface dielectric layer (not shown) may be provided over an upper surface of the second semiconductor layer 16. The surface dielectric layer (not shown) is preferably an oxide, nitride, oxynitride, or other insulating layer that is formed atop the second semiconductor layer 16 after wafer bonding by either a thermal process (i.e., oxidation, nitridation or oxynitridation) or by deposition. Notwithstanding the origin of the surface dielectric layer (not shown), the surface dielectric layer (not shown) has a thickness from about 3 nm to about 500 nm, with a thickness from about 50 nm to about 100 nm being more typical.

Figure 3:
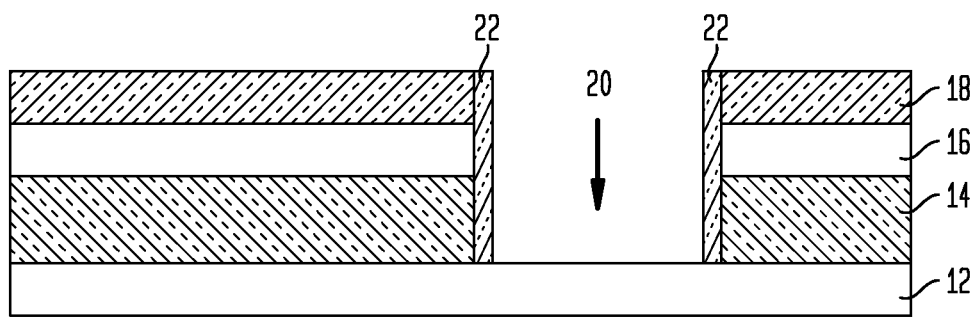

A blanket dielectric mask layer 18 is formed over an upper surface of the bonded substrate, as shown in FIG. 2. Such a blanket dielectric mask layer 18 is then patterned by conventional lithographic and etching techniques to define a set of protected regions and a set of unprotected regions on the substrate surface, as shown in FIG. 3. The patterned dielectric mask layer 18 allows selectively etching at the unprotected regions for removal of portions of the second semiconductor layer 16 and the insulator layer 14, thereby forming a trench 20 that extends through layers 16 and 14 and exposes an upper surface of the first semiconductor layer 12, as shown in FIG. 3. The selective etching may be performed utilizing a single etching process or multiple etching steps, including, but not limited to: a dry etching process such as reactive-ion etching, ion beam etching, plasma etching or laser etching, or a wet etching process wherein a chemical etchant is employed or any combination thereof. In a preferred embodiment of the present invention, reactive-ion etching (RIE) is used for such selective etching.

After etching, dielectric spacers 22 are formed along sidewalls of the trench 20, as shown in FIG. 3. The dielectric spacers 22 of the present invention may comprise any suitable insulating material, such as, for example, an oxide, nitride, oxynitride, etc. In this manner, the second semiconductor layer 16 is covered by the dielectric spacers 22, but the upper surface of the first semiconductor layer is exposed in trench 20, which allows subsequent epitaxial growth of semiconductor material therefrom.

Figure 4:
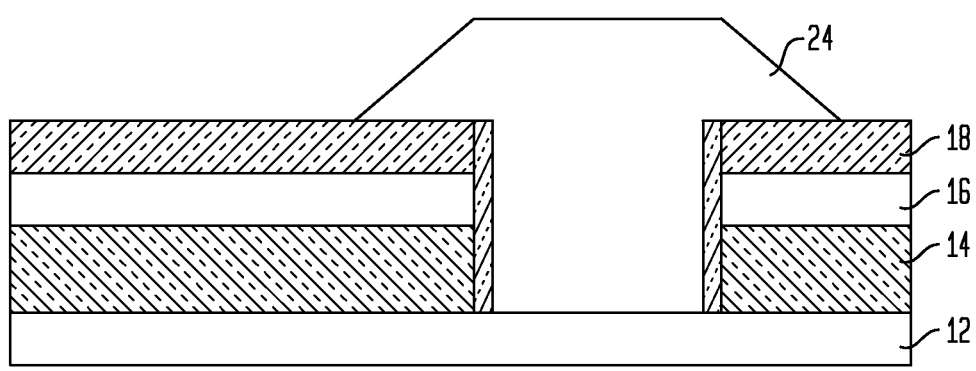

Next, a semiconductor material is grown in the trench 20 by a selective epitaxial growth process to form a semiconductor structure 24, as shown in FIG. 4. The semiconductor material may comprise any Si-containing semiconductor, such as Si, strained Si, SiGe, SiC, SiGeC or combinations thereof, which is capable of being formed utilizing selective epitaxial growth techniques. Because the second semiconductor layer 16 is covered by the dielectric spacers 22, no semiconductor nucleation can proceed from the second semiconductor layer 16. In contrast, the upper surface of the first semiconductor layer 12 is exposed in the trench 20, so that the semiconductor material nucleates and grows from the exposed upper surface of the first semiconductor layer 12 to form the epitaxially grown semiconductor structure 24. Consequently, the semiconductor structure 24 adopts the crystal structure of the first semiconductor layer 12 and therefore has a surface crystal orientation that is the same as that of the first semiconductor layer 12. A portion of the semiconductor structure 24 may overgrow to outside of the trench 20, as shown in FIG. 4.

Figure 5:
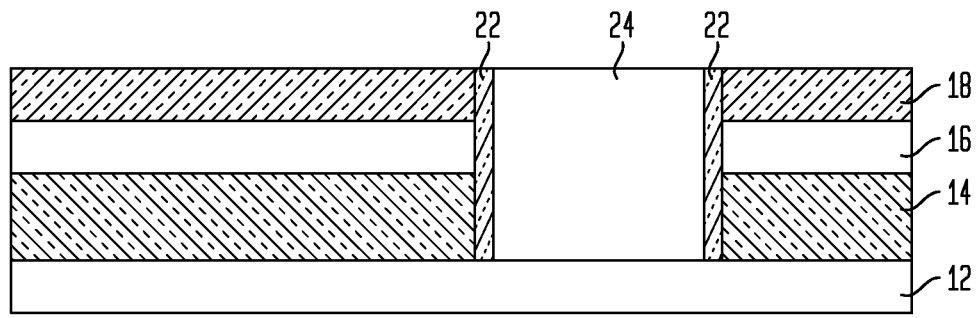

The structure shown in FIG. 4 is then subjected to a planarization process, such as chemical mechanical polishing (CMP) or grinding, so that the over-growing portion of the semiconductor structure 24 is removed, and the remaining portion of the semiconductor structure 24 is substantially planar with the dielectric hard mask layer 18, as shown in FIG. 5.

Figure 6:
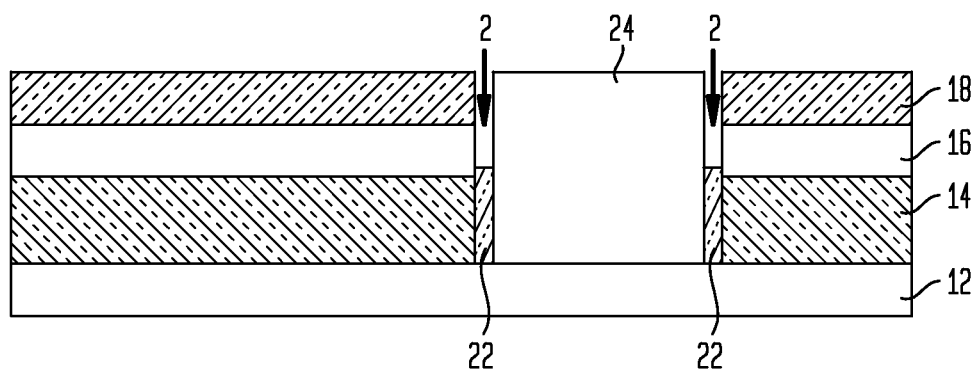

Subsequently, a selective etching step is carried out to selectively remove an upper portion of the dielectric spacers 22 relative to the dielectric hard mask layer 18 and the semiconductor substrate 24. The dielectric spacers 22 are therefore recessed, preferably to below the upper surface of the second semiconductor layer 16 but above the upper surface of the insulator layer 14, and a divot or gap 2 is formed between the semiconductor structure and the second semiconductor layer 16, as shown in FIG. 6. In a preferred, but not necessary embodiment of the present invention, the dielectric hard mask layer 18 comprises a nitride or a nitrogen-rich oxynitride (i.e., one that comprises more nitrogen atoms than oxygen atoms), while the dielectric spacers 22 comprises an oxide or an oxygen-rich oxynitride (i.e., one that comprises more oxygen atoms than nitrogen atoms). In this manner, the selective etching step can be carried out using an etching chemistry that etches oxides significantly faster than nitrides and semiconductors, such as HF or HF-containing solutions (e.g., buffered HF or diluted HF in de-ionized water).

Figure 7:
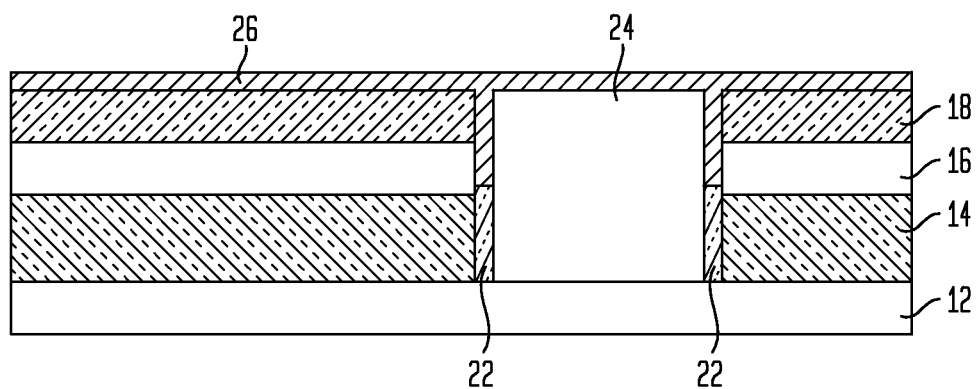

After formation of the divot or gap 2, a conductive material 26 is deposited over the entire structure. Such a conductive material 26 not only fills the divot or gap 2, but also forms a conductive layer over the dielectric hard mask layer 18, as shown in FIG. 7. The conductive material 26 may comprise one or more of doped semiconductors, metals, metal alloys, metal silicides, metal nitrides, and mixtures or combinations thereof. Preferably, the conductive material 26 comprises a doped silicon-containing semiconductor material, such as, for example, doped poly-silicon, α-silicon, or epitaxial silicon. More preferably, the conductive material 26 comprises doped poly-silicon.

Figure 8:
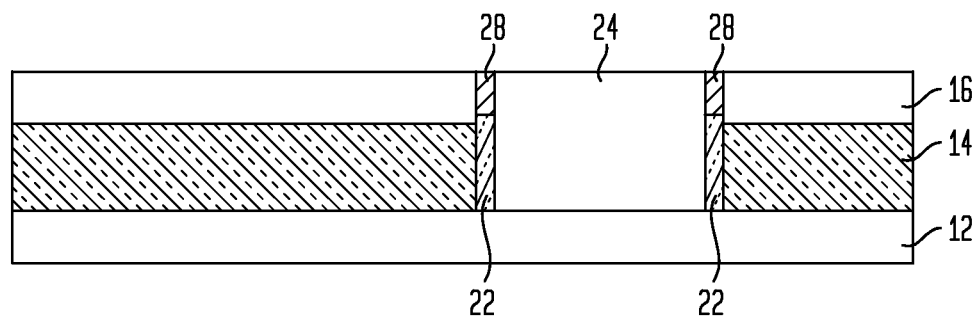

Subsequently, excess doped poly-silicon material 26 is removed from above the dielectric hard mask layer 18 by either a silicon-selective etching process or an oxidation step that forms silicon oxide and followed by an oxide-selective etching process. The dielectric hard mask layer 18 is then removed, as shown in FIG. 8. Because the semiconductor structure 24 has the same surface crystal orientation as the first semiconductor layer 12, i.e., the first surface crystal orientation, and because the second semiconductor layer 16 has the second, different surface crystal orientation, the substrate structure as shown in FIG. 8 constitute a hybrid orientation substrate with different regions of different surface crystal orientations.

Note that a portion of the poly-silicon material 26 remains in the divot or gap 2 and forms a conductive connector 28 that is embedded in the hybrid orientation substrate, as shown in FIG. 8. Such a conductive connector 28 electrically connects the semiconductor structure 24 with the second semiconductor layer 16. Further, the conductive connector 28 is flushed with the substrate surface and does not protrude above the substrate surface.

After planarizing the upper surface of the hybrid orientation substrate, isolation regions 30 are formed in the hybrid orientation substrate. The isolation regions 30 isolate and define a first device region, which comprises a SOI structure with the second semiconductor layer 16 and the insulator layer 14 over the first semiconductor layer 12 and a second device region, which comprises a bulk semiconductor structure with the epitaxially grown semiconductor structure 24 over the first semiconductor layer 12.

The isolation regions 30 are preferably shallow trench isolation regions that can be readily formed utilizing processing steps that are well known to those skilled in the art, which may include, for example, trench definition, etching, optionally lining the trench with a diffusion barrier, and filling the trench with a trench dielectric such as an oxide. After the trench fill, the trench dielectric may be planarized, and an optional densification process step may be performed to densify the trench dielectric.

Figure 9:
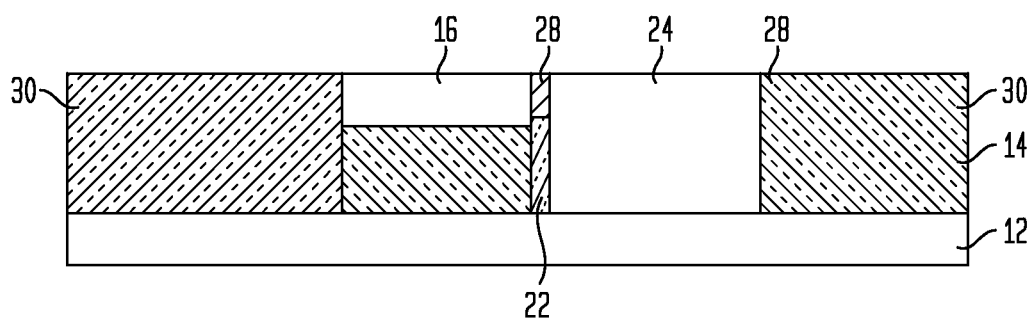

Although the hybrid orientation substrate as shown in FIGS. 8 and 9, either with or without isolation regions 30, contains alternating SOI and bulk structures, the hybrid orientation substrates of the present invention is not so limited, and they may comprise primarily bulk structures or primarily SOI structures, which can be readily configured by using different layered structures for forming bonded substrates that are different from that shown in FIG. 2, as described hereinabove. FIG. 11A shows an embodiment of the present application in which both device regions of the hybrid orientation substrate include SOI structures, while FIG. 11B shows an embodiment of the present application in which both device regions of the hybrid orientation substrate include bulk structures. The reference numerals used in FIGS. 11A and 11B are the same as those found in FIG. 10, except for reference numeral 50 which denotes an another insulator layer (similar to insulator layer 14) present in the structure.

For silicon-based hybrid orientation substrates, it is preferred that the first and second crystal orientations as mentioned hereinabove are selected from the group consisting of the {100}, {110}, {111}, {010}, {001} and {210} planes of silicon. More preferably, it is preferred that one of the first and second crystal orientations is a {100} surface of silicon, which is suitable for subsequent formation of an n-FET thereat, while the other is a {110} surface of silicon, which is suitable for subsequent formation of a p-FET thereat. Alternatively, one of the first and second crystal orientations can be a {100} or a {110} Si plane, while the other can be a {111} Si plane.

Figure 10:
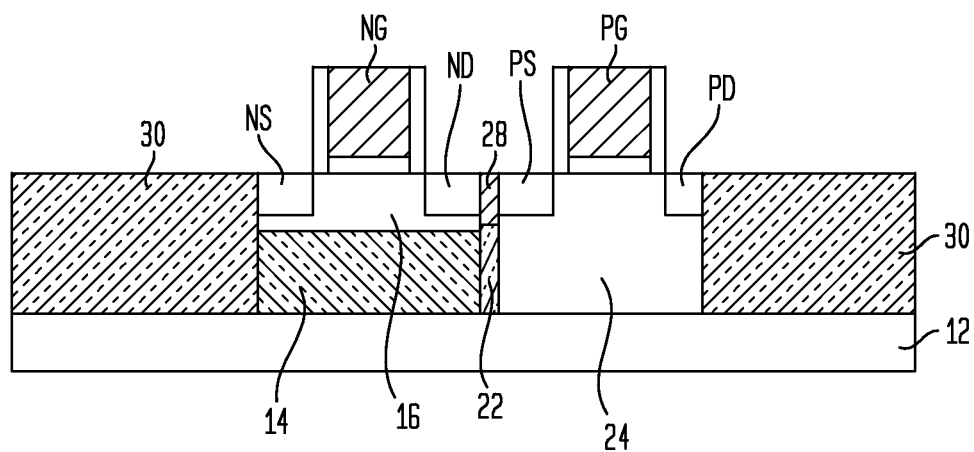
Figure 11A:
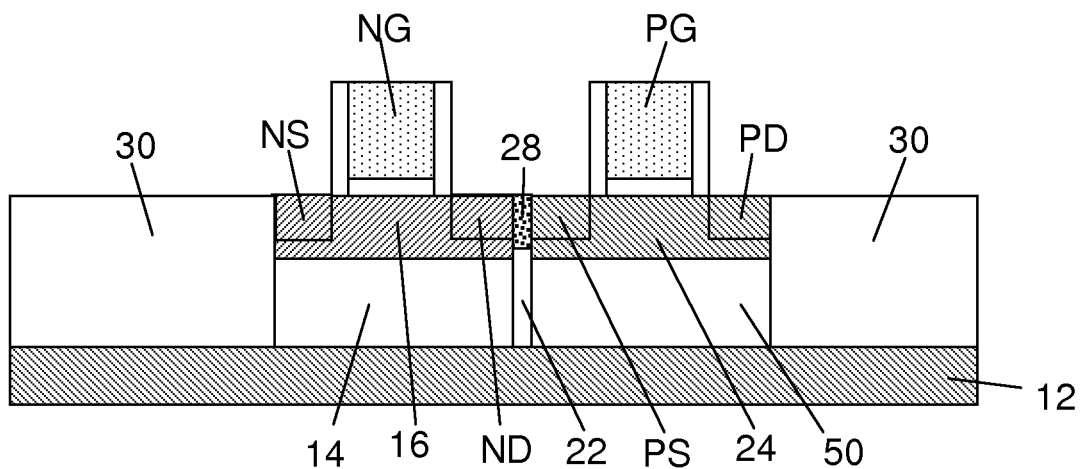
FIGS. 11A and 11B are cross-sectional views illustrating alternative structures that can be formed using the basic processing steps of the present application.
Figure 11B:
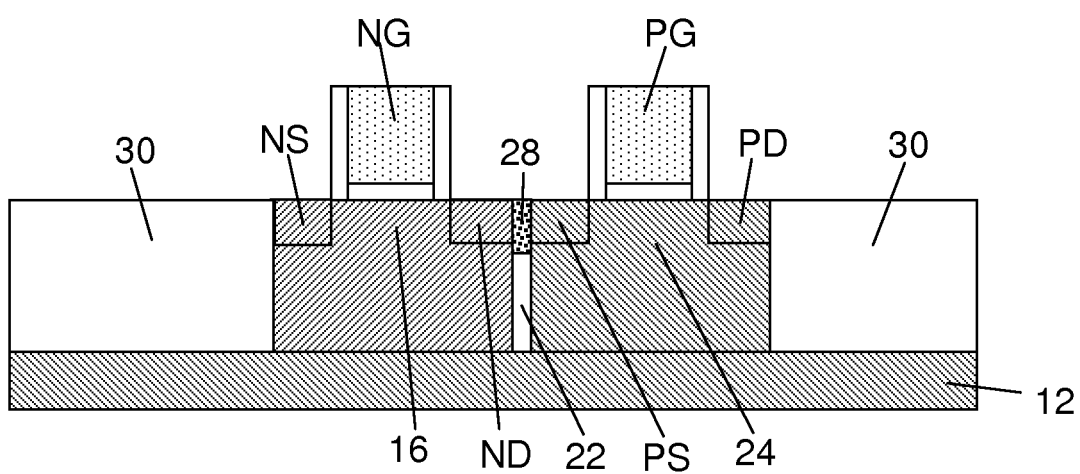

An n-FET and a p-FET can then be respectively formed at the first and second device regions of such a hybrid orientation substrate, as shown in FIG. 10. Specifically, the n-FET comprises a source region NS and a drain region ND located in the second semiconductor layer 16 at the first device region. A channel region (not shown) of the n-FET is located in the second semiconductor layer 16 between the source and drain regions NS and ND, and a gate conductor NG is provided over the channel region (not shown). The p-FET comprises a source region PS and a drain region PD located in the epitaxially grown semiconductor structure 24 at the second device region, with a channel region (not shown) located between the source and drain regions PS and PD and a gate conductor PG located over the channel region (not shown).

The n-FET and p-FET can be readily formed by conventional CMOS processing steps, which are not described in detail here in order to avoid obscuring the present invention.

The embedded conductive connector 28 electrically connects the drain region ND of the n-FET with the source region PS of the p-FET, as shown in FIG. 10. In this manner, no additional processing step is necessary for forming an independent connector between the n-FET and the p-FET. Further, the embedded conductive connector 28 does not protrude above the substrate surface, which minimizes the contact resistance between the n-FET and the p-FET.

During the first planarization step shown in FIG. 5, the upper surface of the epitaxially grown semiconductor structure 24 may be scratched or chipped, resulting in surface defects at the second device region (typically in the amount of about 0.1 to 100 defects/cm$^2$), which will deleteriously affect the device performance of the FET formed thereat. Subsequent deposition of the doped poly-silicon material 26, as shown in FIG. 7, may function to cure at least some of such surface defects. Consequently, the surface defects have depths that are smaller than the thickness of the dielectric hard mask layer 18.

Although the above description is provided primarily in terms of planar FET device structures, for simplicity and illustration purposes only, the present invention is not so limited, but is broadly applicable to other device structures, such as FETs with raised source/drain regions or other complementary devices besides FETs, with or without modifications and variations, as readily determinable by a person ordinarily skilled in the art according to the principles described herein.

It is noted that the drawings of the present invention are provided for illustrative purposes and are not drawn to scale.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor device comprising:
   a semiconductor substrate comprising at least first and second device regions of different surface crystal orientations;
   an n-channel field effect transistor (n-FET) and a p-channel field effect transistor (p-FET), wherein the n-FET comprises source, drain, and channel regions that are located in one of the first and second device regions, wherein the p-FET comprises source, drain, and channel regions that are located in the other of the first and second device regions, and wherein the n-FET and p-FET are electrically connected by a conductive connector that is located between the first and second device regions and embedded in the semiconductor substrate, said conductive connector having an upper surface that is flush with an upper surface of the semiconductor substrate and having a bottommost surface that is present at a greater depth in the semiconductor substrate than a bottommost surface of the source and drain of the nFET and the pFET; and
   a recessed dielectric spacer located between the first and second device regions and under the conductive connector, wherein said conductive connector has outermost sidewall surfaces that are vertically coincident to outermost sidewall surfaces of the recessed dielectric material.

2. The semiconductor device of claim 1, wherein one of the first and second device regions comprises a semiconductor-on-silicon (SOI) structure, and wherein the other of the first and second device regions comprises a bulk semiconductor structure.

3. The semiconductor device of claim 1, wherein both the first and second device regions comprise SOI structures.

4. The semiconductor device of claim 1, wherein both the first and second device regions comprise bulk semiconductor structures.

5. The semiconductor device of claim 1, wherein the conductive connector electrically connects the drain or source region of the n-FET with the source or drain region of the p-FET.

6. The semiconductor device of claim 1, wherein the source, drain, and channel regions of the n-FET are located in the first device region, which has a {100} surface crystal orientation, and wherein the source, drain, and channel regions of the p-FET are located in the second device region, which has a {110} surface crystal orientation.

7. The semiconductor device of claim 1, wherein said recessed dielectric material comprises one of an oxide, a nitride or an oxynitride.

8. The semiconductor device of claim 7, wherein said recessed dielectric material comprises said oxynitride, and said oxynitride has a greater concentration of oxygen atoms than nitrogen atoms.

9. The semiconductor device of claim 1, wherein said conductive connector comprises at least one of a doped semiconductor material, a metal, a metal alloy, a metal silicide, a metal nitride and mixtures and combinations thereof.

10. The semiconductor device of claim 9, wherein said conductive conductor comprises a doped silicon-containing semiconductor material.

11. The semiconductor device of claim 10, wherein said doped silicon-containing semiconductor material comprises doped polysilicon.

12. The semiconductor device of claim 10, wherein said doped silicon-containing semiconductor material comprises doped alpha-silicon.

13. The semiconductor device of claim 10, wherein said doped silicon-containing semiconductor material comprises doped epitaxial silicon.

14. The semiconductor device of claim 1, wherein said recessed dielectric spacer has a topmost surface that forms an interface within the bottommost surface of the conductive connector.

15. The semiconductor device of claim 1, wherein said conductive connector does not protrude above the upper surface of the semiconductor substrate.

16. The semiconductor device of claim 1, wherein said conductive connector connects the drain region of the nFET to the source region of the pFET.

17. The semiconductor device of claim 1, wherein said conductive connector does not contact an uppermost surface of a base semiconductor layer of said semiconductor substrate.

18. The semiconductor device of claim 1, wherein no other conductive connect is located above said upper surface of the semiconductor substrate.

* * * * *